(12) United States Patent
Daval

(10) Patent No.: US 7,531,427 B2
(45) Date of Patent: May 12, 2009

(54) THERMAL OXIDATION OF A SIGE LAYER AND APPLICATIONS THEREOF

(75) Inventor: Nicolas Daval, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 11/773,893

(22) Filed: Jul. 5, 2007

(65) Prior Publication Data

US 2007/0254440 A1 Nov. 1, 2007

Related U.S. Application Data

(63) Continuation of application No. PCT/IB2005/000644, filed on Feb. 24, 2005.

(51) Int. Cl.
  *H01L 21/46* (2006.01)

(52) U.S. Cl. .................. 438/455; 438/769; 257/E21.207

(58) Field of Classification Search ................. 438/455, 438/758, 769, 770; 257/E21.207
See application file for complete search history.

(56) References Cited

U.S. PATENT DOCUMENTS

| | | | |
|---|---|---|---|
| 6,136,684 A | 10/2000 | Sato et al. | 438/624 |
| 6,403,450 B1 | 6/2002 | Maleville et al. | 438/471 |
| 7,071,014 B2 * | 7/2006 | Currie et al. | 438/26 |
| 2003/0089950 A1 | 5/2003 | Kuech et al. | 257/352 |
| 2003/0227057 A1 | 12/2003 | Lochtefeld et al. | 257/347 |
| 2004/0241398 A1 | 12/2004 | Notsu et al. | 428/195.1 |

FOREIGN PATENT DOCUMENTS

EP 0 755 068 A2 1/1997

OTHER PUBLICATIONS

Search report from corresponding International application No. PCT/IB2005/000644 mailed Nov. 7, 2006.

* cited by examiner

*Primary Examiner*—W. David Coleman
(74) *Attorney, Agent, or Firm*—Winston & Strawn LLP

(57) ABSTRACT

The invention concerns a method for oxidizing a surface region of a SiGe layer that includes an oxidizing thermal treatment of the SiGe layer for oxidizing the surface region. The method includes two phases—a first phase of oxidizing thermal treatment, carried out directly on the SiGe layer, so as to obtain an oxidized region which is thick enough for forming a capping oxide which can protect the underlying SiGe from pitting during the subsequent second phase, but thin enough for keeping the thickness of the oxidized surface region under a threshold thickness range, corresponding to the generation of dislocations within the SiGe layer; and—a second phase of high temperature annealing in an inert atmosphere which is carried out on the SiGe layer after the first phase. The SiGe layer is capped with the oxidized region created during the first phase, and the high temperature annealing allows the diffusion of Ge from a Ge-enriched region into the underlying part of the SiGe layer.

24 Claims, 9 Drawing Sheets

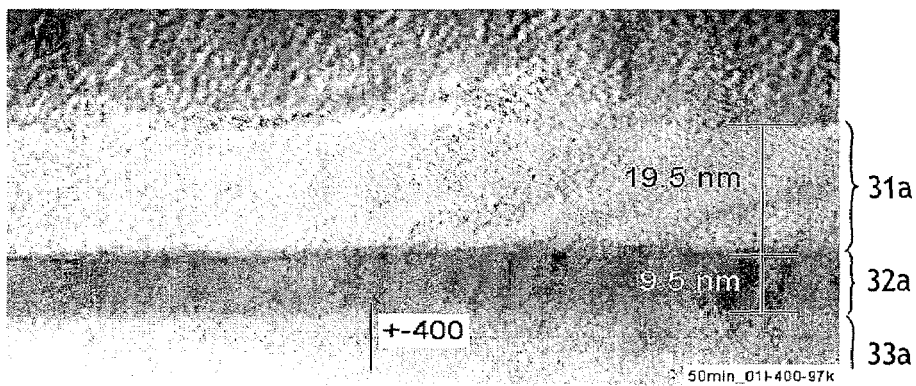
FIG.3a : Ox. 50min 900°C
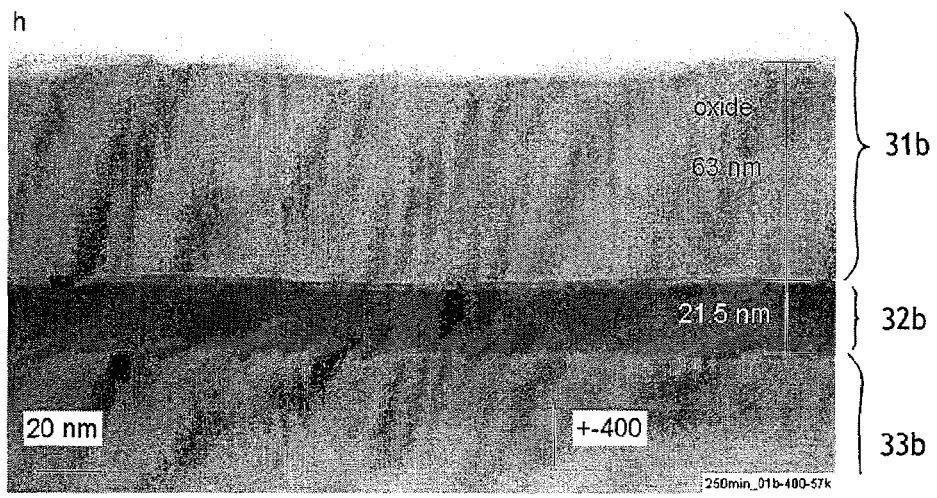
FIG.3b : Ox. 250min 900°C
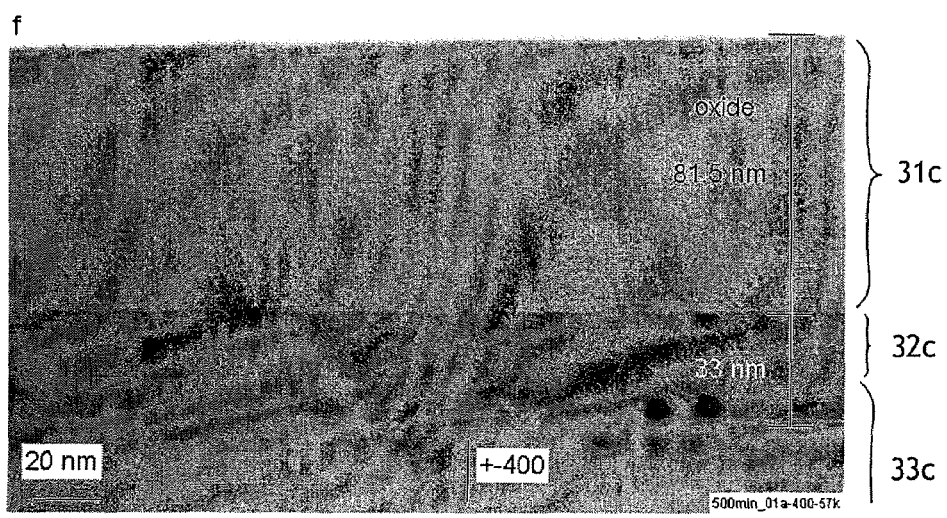
FIG.3c : Ox. 500min 900°C

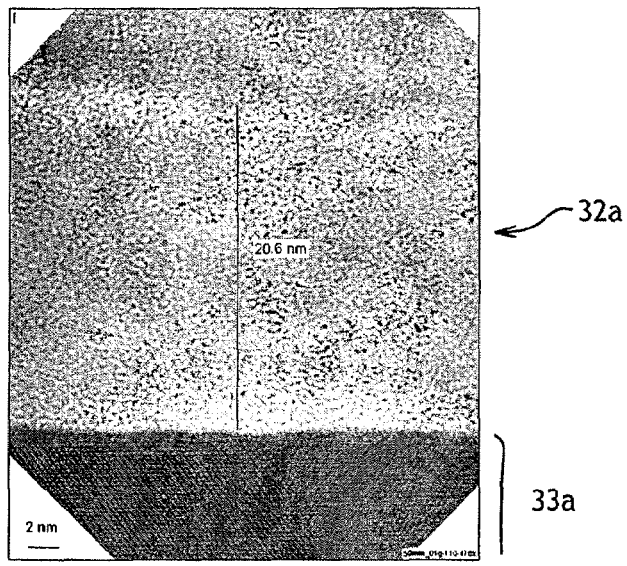
FIG.4a1
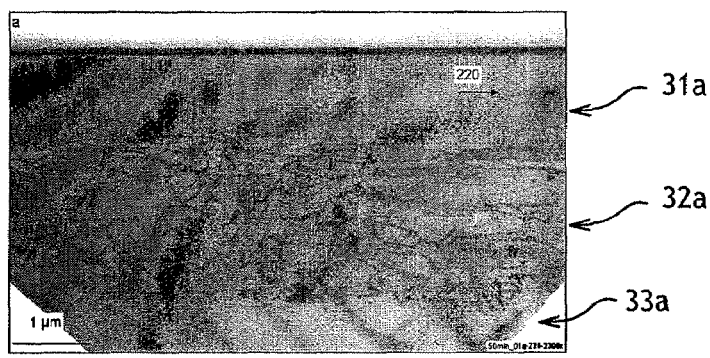
FIG.4a2
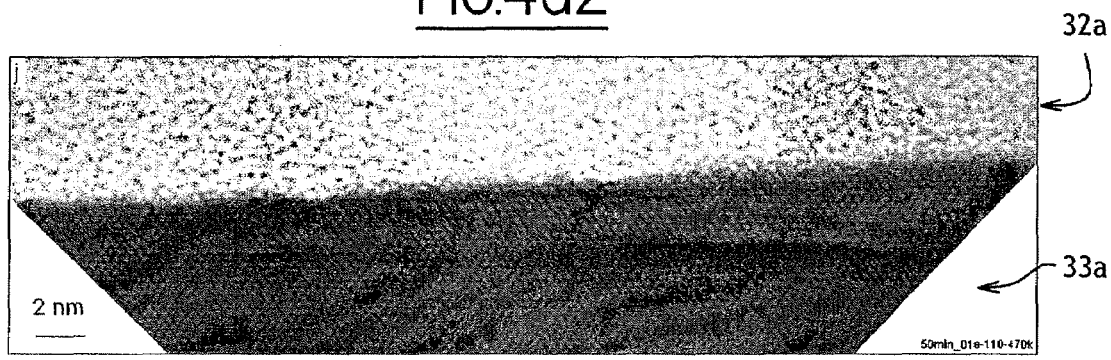
FIG.4a3

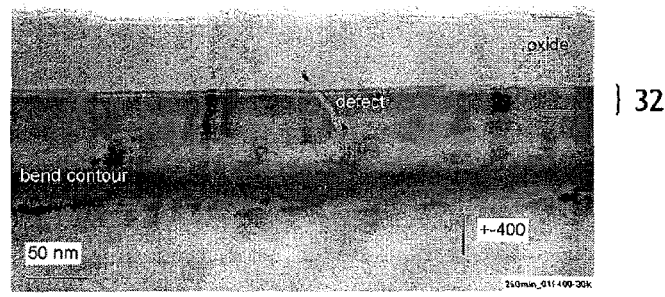
FIG.4b1
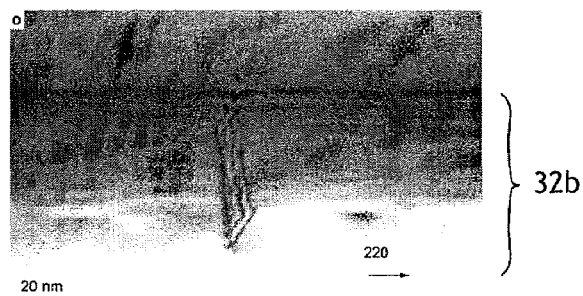
FIG.4b2
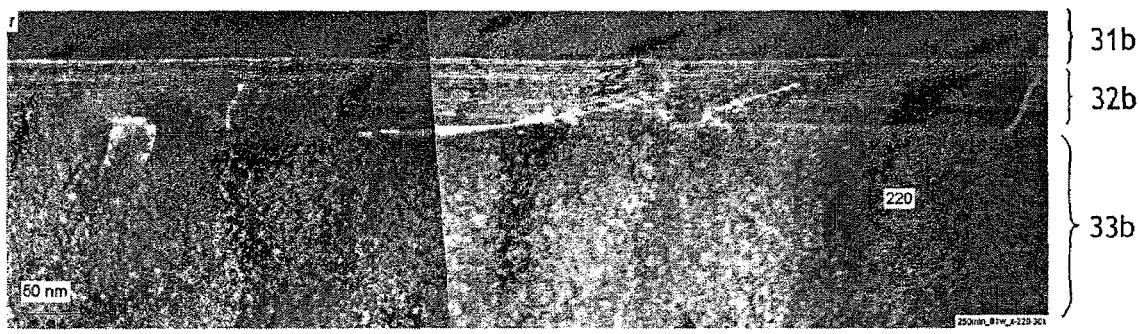
FIG.4b3
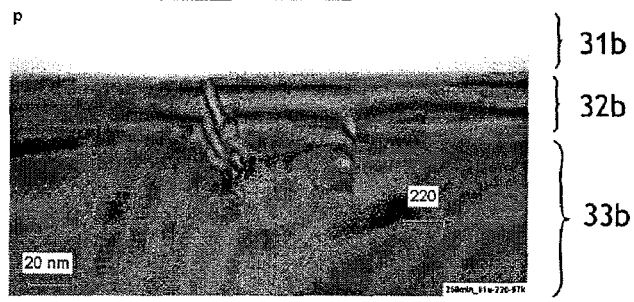
FIG.4b4

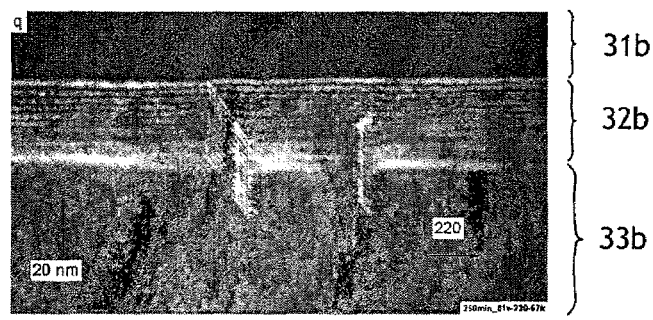
FIG.4b5
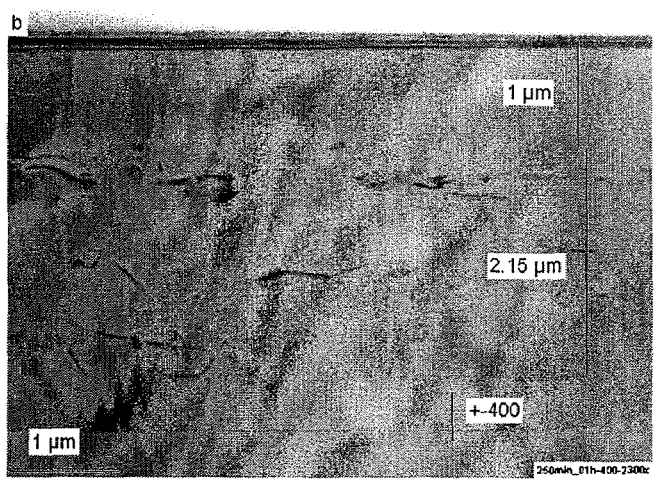
FIG.4b6
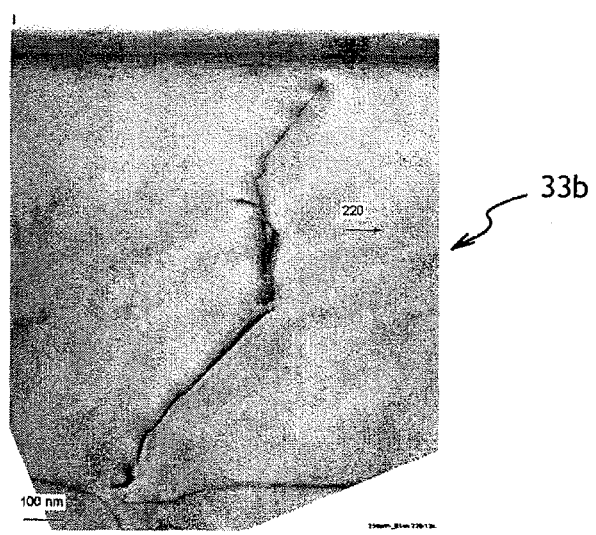
FIG.4b7

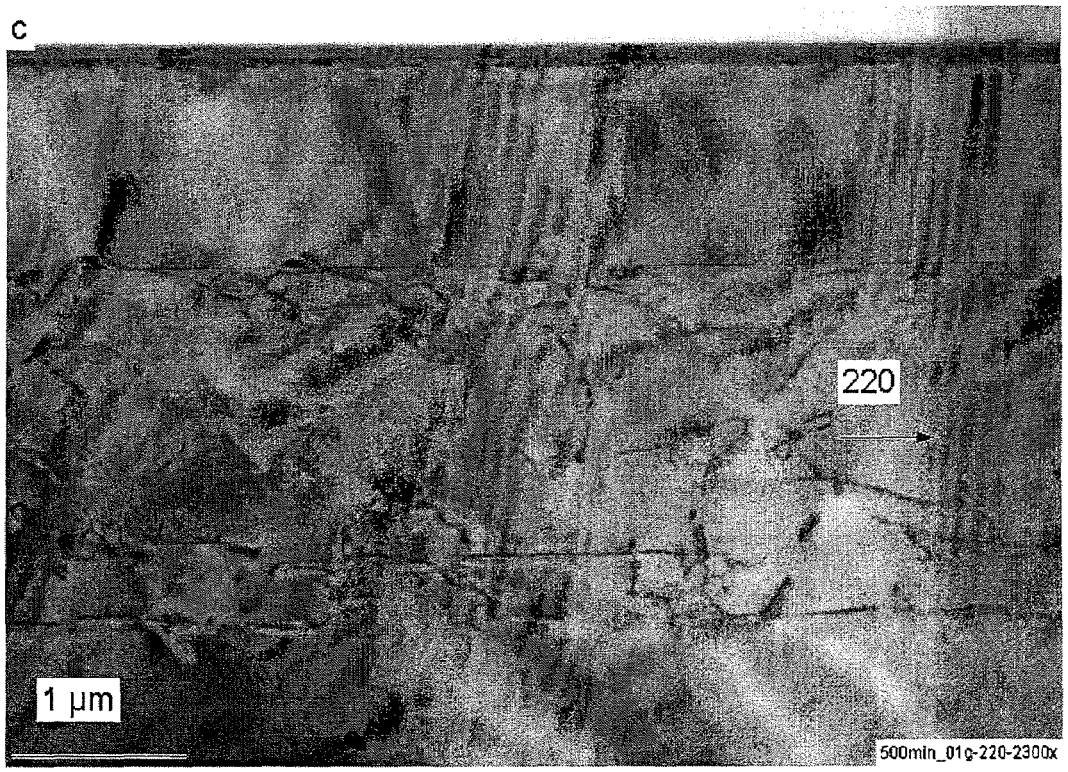
FIG.4c1
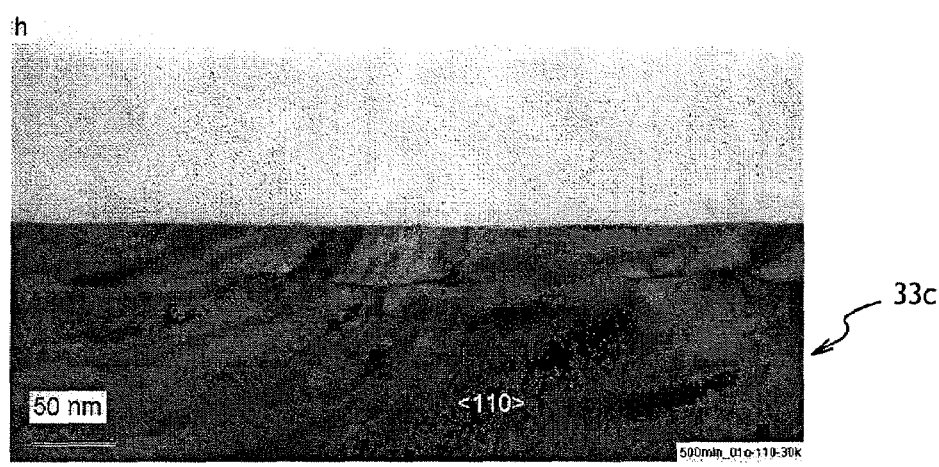
FIG.4c2

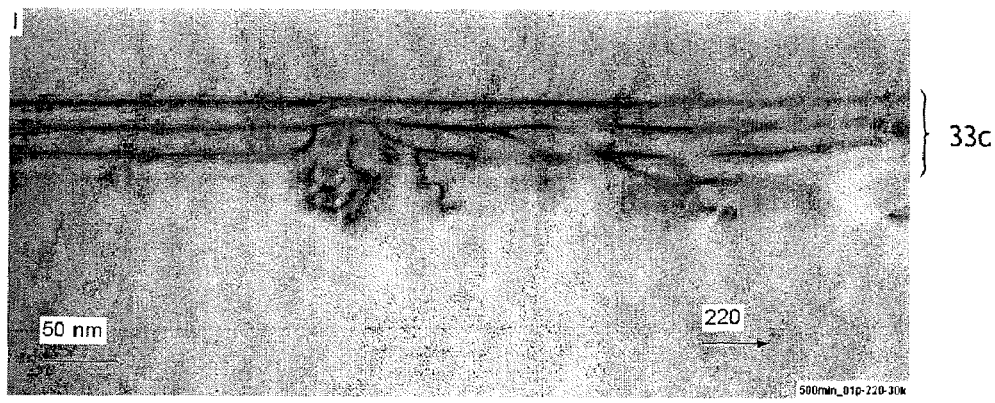
FIG.4c3
FIG.4c4
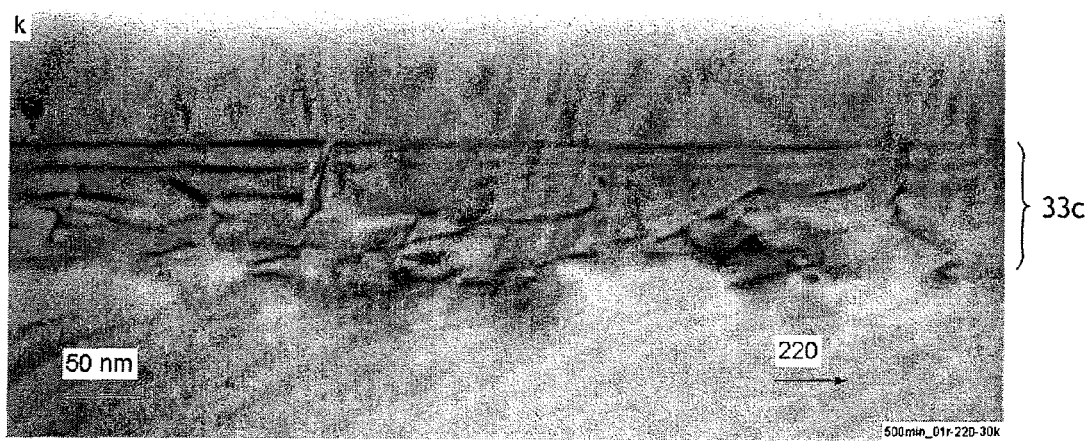
FIG.4c5

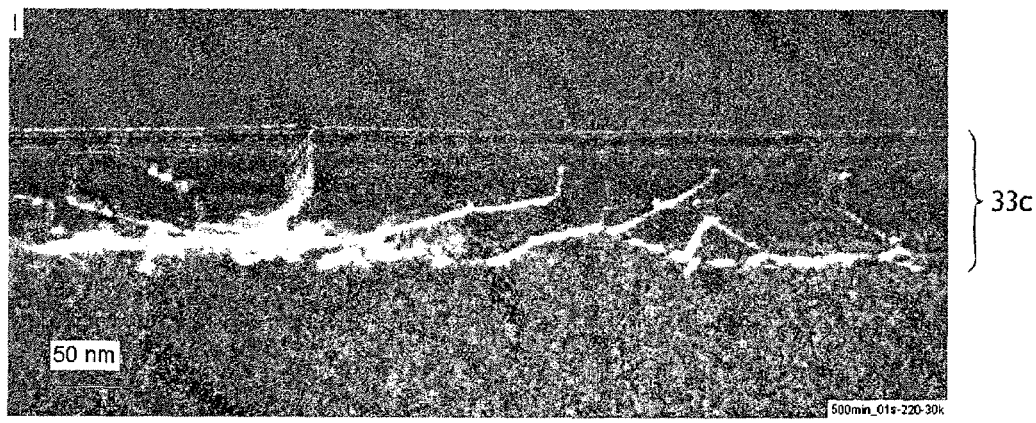
FIG.4c6
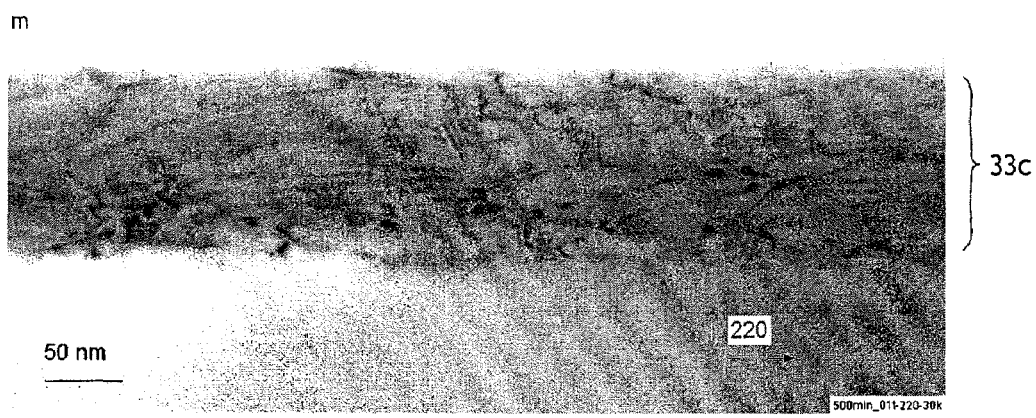
FIG.4c7
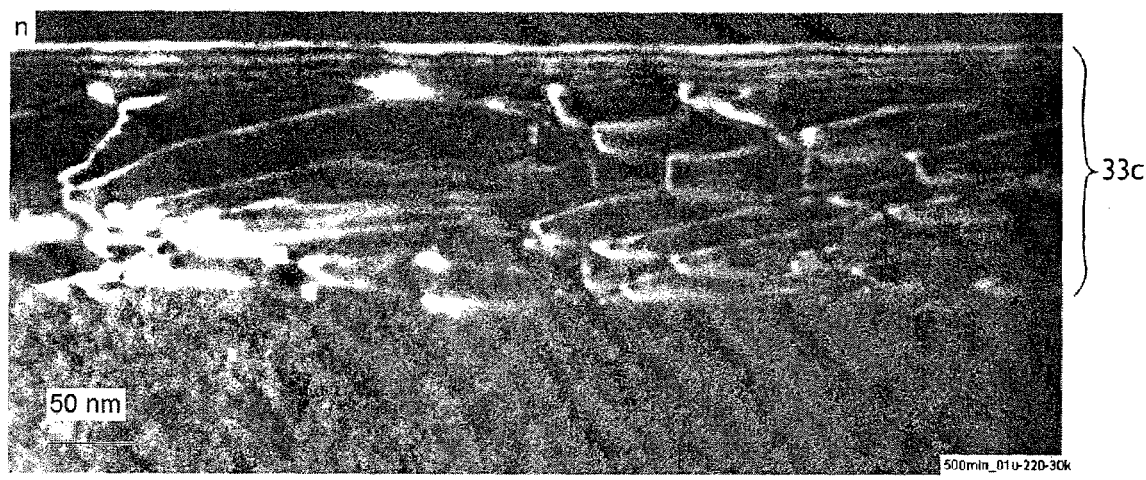
FIG.4c8

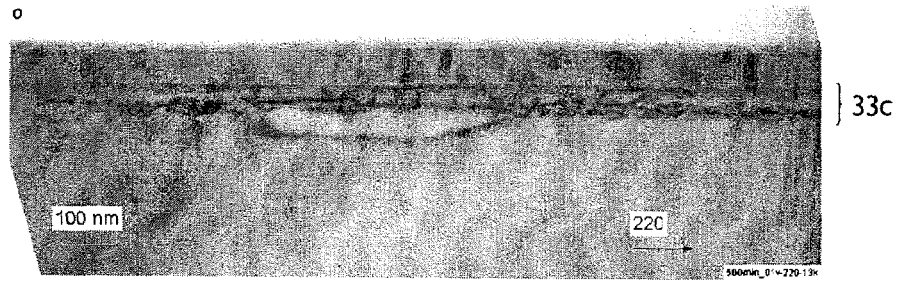
FIG.4c9
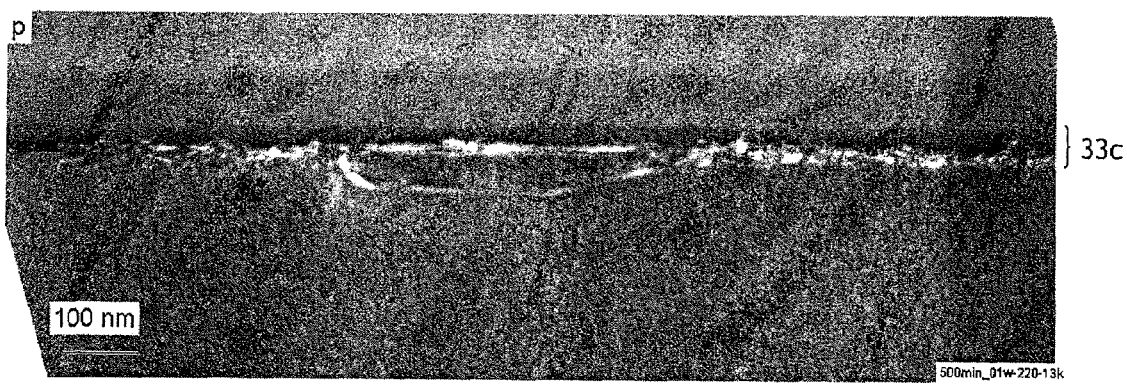
FIG.4c10
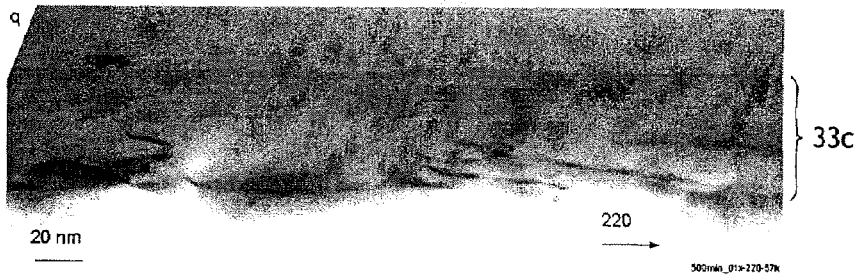
FIG.4c11
FIG.4c12

THERMAL OXIDATION OF A SIGE LAYER AND APPLICATIONS THEREOF

CROSS-REFERENCE TO RELATED APPLICATIONS

This application is a continuation of International application PCT/IB2005/000644 filed Feb. 24, 2005, the entire content of which is expressly incorporated herein by reference thereto.

BACKGROUND

The present invention concerns a method for oxidizing a surface region of a SiGe layer. It also concerns a method for treating a substrate comprising a semi-conducting layer on at least one of its surfaces, the method comprising an annealing of the substrate, the annealing itself comprising an oxidizing thermal treatment of the substrate under an oxidizing atmosphere for oxidizing a surface region of the substrate.

Such methods already exist in general. The annealing of substrates as it is exposed above is typically carried out in a controlled atmosphere. Annealing in a non-oxidizing atmosphere (nitrogen, argon, vacuum, ... ) usually has the drawback of causing a phenomenon known as pitting on the surface of a semiconductor layer, particularly when it is silicon.

On the other hand, annealing in an oxidizing atmosphere is exposed to the drawback of creating defects in the crystal structure of the substrate.

U.S. Pat. No. 6,403,450 (US '450) proposes a solution for annealing a substrate without being exposed to a surface pitting, while at the same time limiting as far as possible the number of defects introduced into the crystal structure of the substrate. US '450 indeed proposes a method which comprises the creation of an oxidized region on a surface of the substrate, before the annealing of the substrate. In such method the oxidized surface region protects the substrate during the annealing—the annealing being carried out in an atmosphere which leaves the oxidized surface region unaffected. US '450 thus provides a solution for limiting the drawbacks mentioned above in relation with the annealing of a substrate.

This solution is well adapted, among others for the treatment of substrates of the SOI (Silicon On Insulator) type. However, the recent evolutions concerning the semiconductor substrates have promoted multilayer substrates which generally comprise a support layer in a material such as e.g. Si, and at least one layer in a semi-conducting material such as SiGe having a lattice parameter which is different from the lattice parameter of the support layer. SGOI (Silicon-Germanium On Insulator) substrates are an example of such substrates.

It would of course be interesting to apply the general solution provided by US '450 on a SGOI substrate. The general solution could be applied by creating the oxidized surface region through a deposition of an oxide. However, this would add a step of deposition in the process—which is not desired since such additional step would be associated to additional time, complexity and costs.

Another way of creating the oxidized surface region would be to proceed through a "direct" oxidation of the SiGe surface of a SGOI substrate (i.e. an oxidation of a surface region of the SiGe layer through a thermal treatment of the SiGe surface). But thermal treatments such as a thermal oxidation would be associated to undesirable effects within the SGOI substrate.

It is indeed known that annealing a SGOI substrate—e.g. for oxidizing its surface—can be associated to specific problems, and in particular to the generation of dislocations within the SiGe layer of the SGOI. Such dislocations within the SiGe layer are generated because of the formation, under the surface oxidized region of the SiGe layer, of a Ge-enriched layer. The annealing indeed rejects Ge from the surface region of the SiGe layer into the thickness of the SiGe layer, and this rejected Ge tends to pile up at the interface between the surface oxidized region and the underlying part of the SiGe layer. This pile up thus forms a Ge-enriched layer, buried between a surface oxidized region and the underlying remainder of the SiGe layer.

This Ge-enriched layer has a lattice parameter which is different from the lattice parameter of the underlying remainder of the SiGe layer. Therefore, as thermal oxidation of the SiGe layer is carried out and as the thickness of the Ge-enriched layer increases, this thickness would reach a value corresponding to the apparition of dislocations due to the lattice parameter mismatch between the Ge-enriched layer and the underlying SiGe. This limitation has been exposed in an article by LeGoues et al. ("Oxidation studies of SiGe"—J. Applied Physics 65(4), 15 Feb. 1989, 1724—see in particular part C: "Structural characterization"). There are thus limitations for applying the general method of US '450 to a SGOI substrate—in particular for applying it through direct oxidation. Accordingly, a new method is needed to avoid these limitations, and this is now provided by the present invention.

SUMMARY OF THE INVENTION

The invention now provides a method for creating an oxidized surface region on a SiGe layer—in particular a SiGe layer of a SGOI substrate—by direct thermal oxidation, without generating defects such as dislocations within the structure of the SiGe layer. The invention also provides a method for annealing a substrate such as a SGOI substrate, in order to stabilize and reinforce a bonding interface between two layers of the substrate. These methods favor a homogeneous distribution of Ge through the SiGe layer.

These advantages are achieved in particular by a method for oxidizing a surface region of a SiGe layer, which comprises oxidizing the surface region of the SiGe layer by conducting a first phase of oxidizing directly on the SiGe layer to form an oxidized surface region which is sufficiently thick to act as a capping oxide to protect the SiGe layer from pitting during further heating while also forming a Ge-enriched region which is located within the SiGe layer immediately beneath the oxidized surface region and a remaining part of the SiGe layer, wherein the oxidized surface region is sufficiently thin to be below a threshold thickness range that would generate dislocations within the SiGe layer due to a lattice parameter mismatch between the Ge-enriched region and the remaining part of the SiGe layer, and conducting a second phase of heat-treating after the first phase of oxidizing by high temperature annealing of the capping oxide, Ge-enriched region and remaining part of the SiGe layer for a time and at a temperature sufficient to allow diffusion of Ge from the Ge-enriched region into the remaining of the SiGe layer.

Preferred but non-limiting aspects of such a method are the following:
  the oxidizing thermal treatment is carried out with a thermal budget corresponding to the formation of a surface oxidized region composed of $SiO_2$,
  the oxidizing thermal treatment is carried out at a temperature which is above a transition temperature, the transition temperature defining a first temperature domain under the transition temperature, where SiGe is oxidized into an oxide of the form $Si_xGe_yO_z$ (with z different from 0), and a high temperature domain above the transition temperature, where SiGe is oxidized into $SiO_2$, the SiGe layer contains 20% Ge and the transition temperature is between 750 and 800° C., the threshold range corresponds to a thickness of 30 to 50 nm for the oxidized surface region, the SiGe layer comprises 20% of Ge, and the oxidizing thermal treatment is carried out at 900° C. during 15 min, the oxidizing thermal treatment is carried out under a pure oxygen atmosphere, the high temperature annealing is carried out with a thermal budget allowing a substantially uniform distribution of Ge within the whole SiGe layer so as to eliminate the Ge-enriched region, the high temperature annealing is carried out at a temperature between 1000 and 1100° C. during 2 hours, the high temperature annealing is carried out at a temperature of 1100° C., The invention furthermore concerns a stabilizing method for stabilizing at least one bonding interface within a SGOI structure comprising a buried oxide layer between a SiGe layer and a support substrate, wherein:

the stabilizing method comprises the application of an oxidizing method as mentioned above to the SiGe layer of the SGOI structure, and the oxidizing thermal treatment of the oxidizing method being carried out on the SGOI structure so as to form a protective oxide capping on the surface of the SiGe layer of the SGOI structure, for protecting the SiGe layer from pitting during the subsequent high temperature annealing of the oxidizing method.

The high temperature annealing allows at the same time:

the stabilization of a bonding interface between the SiGe layer and the buried oxide layer, and/or of a bonding interface between the support substrate and the buried oxide layer, and the diffusion of Ge within the SiGe layer of the SGOI structure, in order to reduce the generation of an oxide of the general form $Si_xGe_yO_z$.

Preferred but non-limiting aspects of such a stabilizing method are the following:

the oxidizing thermal treatment is carried out at a temperature which is above a transition temperature, the transition temperature defining a first temperature domain under the transition temperature, where SiGe is oxidized into an oxide of the form $Si_xGe_yO_z$ (with z different from 0), and a high temperature domain above the transition temperature, where SiGe is oxidized into $SiO_2$, the SiGe layer contains 20% Ge, the oxidizing thermal treatment is carried out for 30 minutes and the transition temperature is between 750 and 800° C., the oxidizing thermal treatment is carried out with a thermal budget which corresponds to the generation on the SiGe layer of a surface oxidized region which is at the same time:

Thick enough to protect the SiGe layer from pitting during the subsequent high temperature annealing, Thin enough to remain under the threshold range.

the surface oxidized region has a thickness of 100 angstroms, the SiGe layer comprises 20% of Ge, and the oxidizing thermal treatment is carried out at 900° C. during 15 min, the high temperature annealing is carried out at a temperature of at least 950° C. during 2 hours, the high temperature annealing is carried out at a temperature between 1000 and 1100° C. during 2 hours, the high temperature annealing is carried out at a temperature of 1100° C.

The invention also concerns a method for bonding a SiGe layer with a substrate layer made of a semiconductor material. The oxidizing method described herein is carried out on the SiGe layer so as to form in the surface region of the SiGe layer a $SiO_2$ oxide layer, and the oxidized SiGe layer is then bonded with the substrate layer. The substrate layer of the SiGe layer which comprises a $SiO_2$ oxide layer in its surface region is implanted so as to form an embrittlement zone in its thickness, in a SMART-CUT® process. The implantation is carried out before the bonding to the surface oxide is removed.

Preferred embodiments include:

the substrate layer is a Si substrate layer, the substrate layer is covered by an oxide layer.

BRIEF DESCRIPTION OF THE DRAWINGS

Other aspects, goals and advantages of the invention shall better appear when reading the following description of preferred embodiments of the invention, made in reference to the drawings in which.

Figure 1:
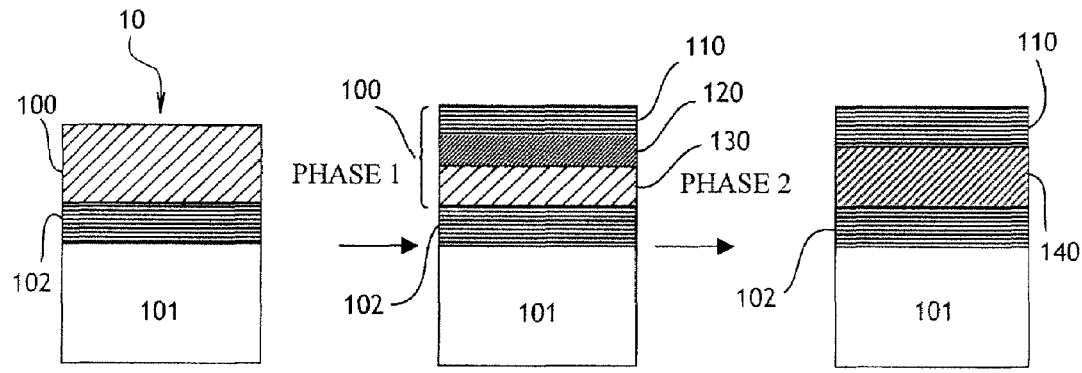
FIG. 1 is a schematical representation of the main general steps of a method according to the invention.
Figure 2:
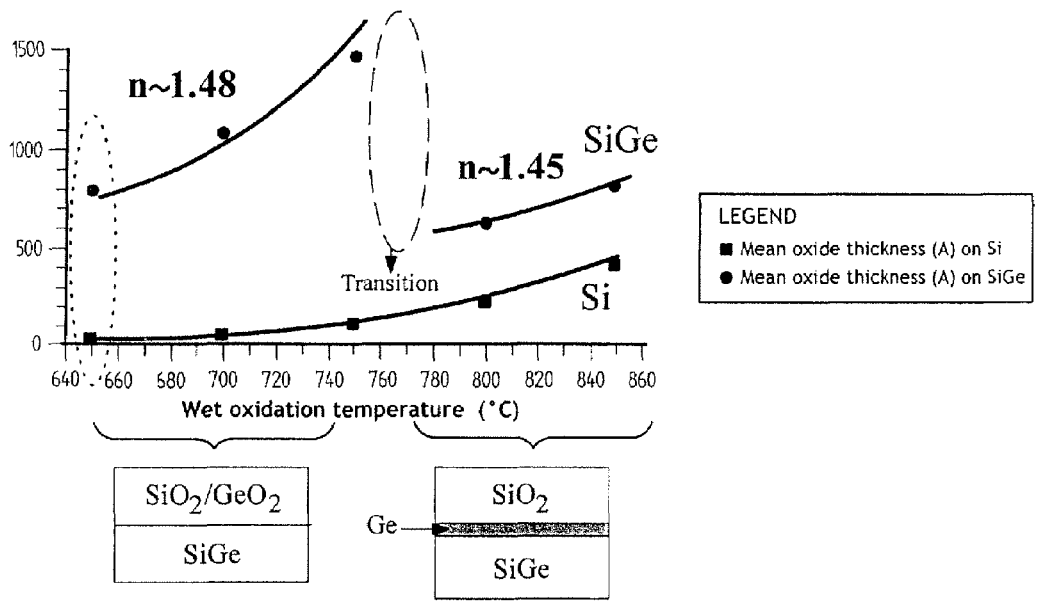
FIG. 2 is a graph showing two temperature domains for a thermal oxidation of a SiGe layer (a first domain where the oxidation generates an oxide of the form $Si_xGe_yO_z$ ($SiGeO_2$); and a second domain where the oxidation generates an oxide of the form $SiO_2$—thereby exhibiting a transition temperature between the two oxidation regimes, FIGS. 3a-3c are TEM images of cross-sections of three different samples of SiGe layers, after these samples have undergone three different types of oxidizing thermal treatments.

Thermal oxidation at 900° C. during 50 minutes (sample of FIG. 3a),

Thermal oxidation at 900° C. during 250 minutes (sample of FIG. 3b),

Thermal oxidation at 900° C. during 500 minutes (sample of FIG. 3c),

FIGS. 4a1-4a3 are TEM images illustrating the absence of defects in the sample of FIG. 3a, after its oxidation, FIGS. 4b1-4b7 are TEM images illustrating the structure of the sample of FIG. 3b, after its oxidation:

FIGS. 4b1-4b2 illustrate defects in a Ge-enriched region of the sample,

FIGS. 4b3-4b5 illustrate defects at the interface between the Ge-enriched region and the underlying SiGe of the sample, FIGS. 4b6-4b7 illustrate a threading dislocation through the SiGe layer of the sample, FIGS. 4c1-4c12 are TEM images illustrating the structure of the sample of FIG. 3c, after its oxidation—these figures showing in particular a high concentration of defects in the Ge-enriched region of the sample.

DETAILED DESCRIPTION OF THE PREFERRED EMBODIMENTS

Method for Oxidizing a Surface Region of a SiGe Layer

A first aspect of the invention is a method for oxidizing a surface region of a SiGe layer, the method comprising an oxidizing thermal treatment of the SiGe layer under an oxidizing atmosphere for oxidizing the surface region.

Such method comprises two phases:
- a first phase of oxidizing thermal treatment, which is carried out directly on the SiGe layer, and
- a second phase of high temperature annealing which is carried out on the SiGe layer after the first phase, in an inert atmosphere.

The first phase is carried out under an oxidizing atmosphere. It can be conducted as a dry thermal oxidation, or as a wet thermal oxidation.

This first phase is carried out so as to obtain an oxidized region of the SiGe layer which is thick enough for forming a capping oxide which can protect the underlying SiGe from pitting during the subsequent second phase.

Moreover, this first phase is also carried out so as to obtain an oxidized surface region of the SiGe layer with a limited thickness.

Indeed, in such method the thickness of the surface oxidized region of the SiGe layer must remain under a threshold thickness range.

The threshold range corresponds to the generation of dislocations within the SiGe layer due to a lattice parameter mismatch between:
- the Ge-enriched region which is formed by the migration of Ge away from the surface during the oxidizing thermal treatment, and
- the underlying remainder of the SiGe layer.

The invention thus exploits the existence of a "threshold thickness range" which corresponds to the apparition of dislocations. The second phase is carried out after the first phase, on the SiGe layer covered by the surface oxidized region created during the first phase. This oxidized surface region forms a capping oxide, which shall protect the underlying part of the SiGe layer from pitting during the high temperature annealing to come.

It is specified that at this stage this "underlying part" of the SiGe layer (i.e. the part lying under the surface oxidized region) comprises a Ge-enriched layer. The high temperature annealing of the second phase allows the diffusion of Ge from this Ge-enriched region into the underlying part of the SiGe layer. Such oxidizing method allows to create an oxidized region at the surface of a SiGe layer, while avoiding at the same time pitting as well as dislocations.

FIG. 1 illustrates the two phases of this method, applied to a SiGe layer 100 which is here part of a structure 10 also comprising a support layer 101 (which can be e.g. in Si) and a buried oxide layer 102 between the SiGe layer and the support layer. The structure 10 is typically a circular wafer comprising very thin layers—these layers being not drawn at real scale on the figures.

In the first phase, the oxidizing thermal treatment is carried out so as to create from the surface region of the initial SiGe layer 100 an oxidized surface region 110. As mentioned above, this surface region is thick enough for protecting the underlying regions of the SiGe layer from pitting during the subsequent high temperature annealing. And it is at the same time thin enough so as to remain under the thickness threshold range mentioned above. Immediately under the oxidized region 110 is a Ge-enriched region 120 formed by the migration of Ge away from the oxidized region 110, during thermal oxidation. And a remainder 120 of the SiGe layer lies under the Ge-enriched region 110. This remainder is composed of substantially pure SiGe, with the same composition as the original SiGe layer.

In the second phase, a high temperature annealing is applied to the structure obtained after the first phase. This high temperature annealing favors the diffusion of Ge between the regions 120 and 130. And this high temperature annealing is carried out until such diffusion is complete, i.e. until the two regions 120 and 130 form a single and homogeneous region 140, under the surface oxidized region 110 which is unaffected by the high temperature annealing.

Method for Stabilizing a Bonding Interface

The invention finds an advantageous application in the stabilization of a bonding interface between a SiGe layer and another layer. Such two layers bonded together can in particular be two layers of a SGOI structure, with an oxide layer buried between the SiGe layer and a support layer of the SGOI structure. Such a configuration is illustrated in FIG. 1.

In this application of the invention, the stabilizing method comprises applying an oxidizing method as mentioned above to the SiGe layer of the SGOI structure. And the oxidizing thermal treatment (i.e. the first phase) of the oxidizing method is carried out on the SGOI structure so as to form a protective oxide capping on the surface of the SiGe layer of the SGOI structure, for protecting the SiGe layer from pitting during the subsequent high temperature annealing of the oxidizing method.

The high temperature annealing (second phase) of the oxidizing method allows at the same time:
- the stabilization of a bonding interface between two layers which have been bonded (by molecular adhesion resulting from a simple contact between two surfaces which have an extremely low roughness)
  this bonding interface can be an interface between the SiGe layer and the buried oxide layer, and/or between the support substrate and the buried oxide layer of the structure,
- and the diffusion of Ge within the SiGe layer of the structure, in order to reduce the generation of an oxide comprising Si, Ge and O (i.e. an oxide of the general form $Si_xGe_yO_z$).

Method for Bonding

Another advantageous application of the invention is a bonding method of a SiGe layer with a substrate layer made of a semiconductor material, wherein an oxidizing method as mentioned above is carried out on the SiGe layer so as to form in the surface region of the SiGe layer a $SiO_2$ oxide layer, and the oxidized SiGe layer is then bonded with the substrate layer. In such application, the oxidizing method should preferably be carried out so that thermal budget of its first phase (oxidizing thermal treatment) allows the formation on the SiGe layer of a surface oxidized region which is composed of $SiO_2$. $SiO_2$ placed between two layers to be bonded (i.e. $SiO_2$ on one surface to be bonded, or on both) indeed favors the bonding of such layers.

Application to a SMART-CUT® Process

As exposed above, the invention can be applied to the bonding of a SiGe layer with another layer. Such "other layer" can be a substrate layer which corresponds to the base (or "receiving") layer of a SMART-CUT® process. In a preferred application, the SiGe layer has been oxidized so as to form a $SiO_2$ oxidized region on it, and before being bonded to the substrate layer this SiGe layer is implanted so as to form an embrittlement zone in its thickness. The implantation is typically carried out with species such as H and/or He.

The oxidized surface region protects the SiGe from undesired effects during the implantation. These undesired effects include in particular:
contamination by hydrocarbons, a possible channelling that would be created by implantation in the structure of the SiGe layer. The $SiO_2$ surface region covering this SiGe layer is indeed amorphous and limits such effect of channelling.

The oxidized surface region on the SiGe layer can be used as a bonding layer after the implantation, for the bonding of the SiGe layer with the substrate layer. Alternatively, this surface oxidized region can also be removed after the implantation and before the bonding of the implanted SiGe layer with the substrate layer. In such case the main function of the oxidized region is to protect the SiGe layer from the undesired effects of implantation.

If the surface oxidized region is removed before bonding, such removal should preferably be carried out through a HF etching. The substrate layer can typically be a substrate layer in Si. And the substrate layer can itself be covered by an oxide, before the bonding.

After the implantation and bonding, the subsequent steps of a SMART-CUT® process are carried out (cleaving at the embrittlement zone created by implantation, and finishing e.g. by polishing). Applying the invention in a SMART-CUT® process allows to perform such a process on a SiGe top (or "donor") layer without having to go through a deposition step of an oxide on such layer.

The following explanations and details concern all the aspects of the invention which have been mentioned above (method for oxidizing a surface region of a SiGe layer, method for stabilizing, method for bonding). The SiGe layer can have a Ge concentration of 20%, and this value is used as a basis for many examples described below. However, such value of the Ge concentration is not limitative.

Oxidizing Thermal Treatment (First Phase)

The oxidizing thermal treatment can be carried out as a dry oxidation, or as a wet oxidation. It can be carried out under a pure oxygen atmosphere.

Indication on the desired thickness for the oxidized surface region

As exposed above, the oxidizing thermal treatment is carried out so as to fulfill simultaneously two conditions:

the oxidized surface region of the SiGe layer must be thick enough for forming a capping oxide which can protect the underlying SiGe from pitting during the subsequent second phase, but at the same time this oxidized surface region must remain thin enough in order to remain under a threshold thickness range corresponding to the apparition of dislocations.

In an embodiment of the invention, the threshold range is defined by a thickness of 30 to 50 nm for the oxidized surface region of the SiGe layer. This is in particular well-suited for a SiGe layer comprising 20% Ge. And a good value for the thickness of the surface oxidized region is 100 angströms—this value being also well-suited for a SiGe layer comprising 20% Ge.

Generation of a surface oxidized region made of $SiO_2$

Preferably, the oxidizing thermal treatment (first phase) is carried out with a thermal budget corresponding to the formation of a surface oxidized region composed of $SiO_2$. $SiO_2$ is indeed an oxide which is temperature-stable (i.e. its composition is not altered by the exposition to high temperature treatments), which makes it particularly advantageous (among others for undergoing the high temperature annealing of the second phase, and for bonding purposes). For this purpose of obtaining an oxidized surface region which is composed of $SiO_2$, the applicant has exploited observations made on different oxidizing thermal treatments on SGOI wafer structures which were initially identical (with a surface SiGe layer having 20% Ge), the oxidizing thermal treatments having the same duration (30 minutes) but differing by their respective temperatures (these temperatures being in the range 640° C.-860° C.).

The thickness as well as the composition of the oxidized region were observed on each structure after its thermal treatment. From these observations (and in particular from the observation of composition of the oxidized region), it has been observed that a transition temperature could be defined for the oxidizing thermal treatments.

For thermal treatments carried out above this transition temperature, the surface oxidized region formed on the SiGe layer of the structure was $SiO_2$. And for thermal treatments carried out under this transition temperature, the surface oxidized region formed on the SiGe layer of the structure comprised Ge and was of the general form $Si_xGe_yO_z$.

FIG. 2 shows that the transition temperature was between 750 and 800° C. in the case mentioned above (SiGe having 20% Ge, duration of thermal treatments 30 min.). This figure shows that the transition is very-well marked. The upper curve of FIG. 2 shows the thickness of the surface oxidized region of a SiGe layer comprising 20% Ge, as a function of temperature of the 30 min. thermal treatment applied to the SiGe layer. This upper curve is discontinued—and the location of the discontinuity corresponds to the transition temperature.

In addition to the measurement of thickness of the oxidized region, a characterization of the nature of this region was carried out (by observation of the oxide refractive index for the oxidized region) for building the graph of FIG. 2. The left-hand part of the upper curve corresponds to an oxidized region comprising SiGeO2 (refractive index of about 1.48). The right-hand part of this curve corresponds to an oxidized region made of $SiO_2$ (refractive index of about 1.45). The lower curve of the graph shows the thickness of oxide formed on a Si layer, as a function of temperature for a 30 minutes thermal treatment. This curve is continuous since the nature of the oxide formed on Si does not change with the temperature of thermal treatment.

For thermal treatment of the "first phase" mentioned above, when $SiO_2$ is desired as the material of the surface oxidized region of the SiGe layer, thermal treatment is thus carried out at a temperature which is above a transition temperature, the transition temperature defining a first temperature domain under the transition temperature, where SiGe is oxidized into an oxide of the form $Si_xGe_yO_z$ (with z different from 0), and a high temperature domain above the transition temperature, where SiGe is oxidized into $SiO_2$. The graph of FIG. 2 concerns thermal treatments carried out during 30 minutes. However, such duration is not a limitation—and for different durations the transition temperature can have values different from the values mentioned above with reference to FIG. 2.

As an example, the applicant has determined that a thermal treatment carried out on a SiGe layer comprising 20% Ge during 15 minutes, at 900° C., produced an oxidized SiGe layer without noticeable dislocations or pitting. This last example was furthermore well suited for the application to a stabilizing method of a SGOI comprising the SiGe layer.

High Temperature Annealing (Second Phase)

The high temperature annealing of the second phase is carried out with a thermal budget allowing a substantially uniform distribution of Ge within the whole SiGe layer so as to eliminate the Ge-enriched region. This annealing is carried out in an inert atmosphere. For a SiGe layer comprising 20%

Ge, such thermal budget typically corresponds to an annealing carried out at a temperature over 950° C. during 2 hours. More precisely, an annealing carried out at temperatures between 1000 and 1100° C. during two hours is particularly advantageous. Even more precisely, an annealing carried out during two hours at 1100° C. is particularly preferred since the applicant has observed that such conditions are necessary in order to reach a thermal budget which allows to obtain a high bonding energy (2 J/m$^2$). Such values have in particular been characterized as advantageous for stabilizing the SGOI structure mentioned in the example exposed with reference to the first phase (oxidizing thermal treatment carried out for 15 minutes at 900° C.).

FIGS. 3a-3c are TEM images of cross-sections of three different samples of SiGe layers, after these samples comprising 20% Ge and having undergone three different types of oxidizing thermal treatments:

Thermal oxidation at 900° C. during 50 minutes (sample of FIG. 3a),

Thermal oxidation at 900° C. during 250 minutes (sample of FIG. 3b),

Thermal oxidation at 900° C. during 500 minutes (sample of FIG. 3c).

These three samples exhibit a surface oxidized region generally referenced 31 (i.e. 31a, 31b, 31c for the three respective figures), and a pile-up region immediately under this surface oxidized region. The pile-up region (generally referenced 32) corresponds to the Ge-enriched region where Ge has migrated and accumulated during thermal oxidation. The three figures are not exactly drawn with according scales.

The following table summarizes the features of the three samples (including the roughness of the interface between the pile-up region and the underlying remainder of the SiGe layer (generally referenced 33):

| | | | sample | | |
|---|---|---|---|---|---|
| Oxidation 900° C. | Oxide thickness (nm) | Ge-pile up (nm) | Interface roughness | Defect density pile-up (cm−2) | # of defects theading dislocations SiGe buffer |
| 25 nm for 50 min | 19-23 | 9.5-11.5 | ca 4 nm | 0 | 0 (over 30 μm length) |
| 60 nm for 250 min | 63 | 19-21.5 | ca 3 nm | 2e8 cm-2 | 2 (over 60 μm length) |
| 85 nm for 500 min | ca 81.5 | ca 33 | ca 3 nm | 3e12 cm-2 | 0 (over 150 μm length) |

FIGS. 4a1-4a3 are TEM images illustrating the absence of defects in the sample of FIG. 3a, after its oxidation.

It can be observed that:

There is no defect at the interface between the pile-up (Ge enriched) region 32a and the underlying remainder 33a of the SiGe layer, There is no defect within the remainder 33a of the SiGe layer.

The oxidation of the first sample (illustrated in FIGS. 3a, and 4a1-4a3) has been carried out according to the "first phase" of the method of the invention.

FIGS. 4b1-4b7 are TEM images illustrating the structure of the sample of FIG. 3b, after its oxidation (second sample).

FIGS. 4b1-4b2 illustrate defects in a Ge-enriched region 32b of this sample. Its oxidation has thus not been carried out according to the "first phase" of the method of the invention.

FIGS. 4b3-4b5 furthermore illustrate defects at the interface between the Ge-enriched region 32b and the underlying remainder of SiGe 33b of the sample. The measured defects concentration was 2.10$^8$ defects/cm$^2$. Moreover, FIGS. 4b6-4b7 illustrate a threading dislocation through the whole SiGe layer 33b of this second sample.

FIGS. 4c1-4c12 are TEM images illustrating the structure of the sample of FIG. 3c (third sample), after its oxidation. These figures show in particular a high concentration of defects in the Ge-enriched region 33c of the sample. It is thus clear that thermal oxidation of this third sample has not been carried out according to the "first phase" of the method of the invention.

What is claimed is:

1. A method for providing a homogeneous distribution of germanium in an SiGe layer when oxidizing a surface region thereof, which comprises directly oxidizing the surface region of the SiGe layer by:

conducting a first phase of directly oxidizing the SiGe layer to form an oxidized surface region which is sufficiently thick to act as a capping oxide to protect the SiGe layer from pitting during further heating while also forming a Ge-enriched region which is located within the SiGe layer immediately beneath the oxidized surface region and a remaining part of the SiGe layer, wherein the oxidized surface region is sufficiently thin to be below a threshold thickness range that would generate dislocations within the SiGe layer due to a lattice parameter mismatch between the Ge-enriched region and the remaining part of the SiGe layer, and conducting a second phase of high temperature annealing in an inert atmosphere of the capping oxide, Ge-enriched region and remaining part of the SiGe layer for a time and at a temperature sufficient to allow diffusion of Ge from the Ge-enriched region into the remaining of the SiGe layer to provide the homogeneous distribution of germanium within the remaining SiGe layer.

2. The method of claim 1 wherein the oxidizing thermal treatment is carried out with a thermal budget corresponding to that required for formation of a surface oxidized region composed of SiO$_2$.

3. The method of claim 1 wherein the threshold thickness range corresponds to a thickness of 30 to 50 nm for the oxidized surface region.

4. The method of claim 1 wherein the SiGe layer comprises 20% of Ge, and the oxidizing thermal treatment is carried out at 900° C. during 15 min.

5. The method of claim 1 wherein the first phase of oxidizing is carried out under a pure oxygen atmosphere.

6. The method of claim 1 wherein the second phase high temperature annealing is carried out with a thermal budget allowing a substantially uniform distribution of Ge within the whole SiGe layer so as to eliminate the Ge-enriched region.

7. A method for stabilizing at least one bonding interface within a SGOI structure comprising a buried oxide layer between a SiGe layer and a support substrate, which method comprises applying an oxidizing method according to claim 1 to the SiGe layer of the SGOI structure, with the first phase oxidizing being carried out on the SGOI structure so as to form a protective oxide capping on the surface of the SiGe layer of the SGOI structure, for protecting the SiGe layer from pining during the subsequent high temperature annealing of the oxidizing method, and the second phase high temperature annealing allowing at the same time the stabilization of a bonding interface between the SiGe layer and the buried oxide layer, or of a bonding interface between the support substrate and the buried oxide layer, and the diffusion of Ge within the SiGe layer of the SGOI structure, in order to reduce the generation of an oxide of the general form Si$_x$Ge$_y$O$_z$.

8. The method of claim 2 wherein the oxidizing thermal treatment is carried out at a temperature which is above a transition temperature, the transition temperature defining a first temperature domain under the transition temperature where SiGe is oxidized into an oxide of the form $Si_xGe_yO_z$ (with z different from 0), and a high temperature domain above the transition temperature where SiGe is oxidized into $SiO_2$.

9. The method of claim 8 wherein the SiGe layer contains 20% Ge and the transition temperature is between 750 and 800° C.

10. The method of claim 6 wherein the second phase high temperature annealing is carried out at a temperature between 1000 and 1100° C. during 2 hours.

11. A method for bonding a SiGe layer with a substrate layer made of a semiconductor material, which comprises conducting a method according to claim 6 on the SiGe layer so as to form in the surface region of the SiGe layer a $SiO_2$ oxide layer, and the oxidized SiGe layer is then bonded with the substrate layer.

12. The method of claim 10 wherein the high temperature annealing is carried out at a temperature of 1100° C.

13. The method of claim 11 wherein before being bonded to the substrate layer the SiGe layer which comprises a $SiO_2$ oxide layer in its surface region is implanted so as to form an embrittlement zone in its thickness, in a layer transfer process.

14. The method of claim 13 wherein after the implantation and before the bonding the surface oxide is removed.

15. The method of claim 11 wherein the substrate layer is a Si substrate layer.

16. The method of claim 11 wherein the substrate layer is covered by an oxide layer.

17. The method of claim 7 wherein the first phase oxidizing is carried out at a temperature which is above a transition temperature, the transition temperature defining a first temperature domain under the transition temperature, where SiGe is oxidized into an oxide of the form $Si_xGe_yO_z$ (with z different from 0), and a high temperature domain above the transition temperature, where SiGe is oxidized into $SiO_2$.

18. The method of claim 7 wherein the first phase oxidizing is carried out with a thermal budget which corresponds to the generation on the SiGe layer of a surface oxidized region which is at the same time thick enough to protect the SiGe layer from pitting during the subsequent high temperature annealing, yet thin enough to remain under the threshold range.

19. The method of claim 7 wherein the SiGe layer comprises 20% of Ge, and the first phase oxidizing is carried out at 900° C. for 15 min.

20. The method of claim 17 wherein the SiGe layer contains 20% Ge, the oxidizing thermal treatment is carried out for 30 minutes and the transition temperature is between 750 and 800° C.

21. The method of claim 18 wherein the surface oxidized region has a thickness of 100 angströms.

22. The method of claim 19 wherein the second phase high temperature annealing is carried out at a temperature of at least 950° C. for 2 hours.

23. The method of claim 22 wherein the high temperature annealing is carried out at a temperature between 1000 and 1100° C. for 2 hours.

24. The method of claim 23 wherein the high temperature annealing is carried out at a temperature of 1100° C.

* * * * *

UNITED STATES PATENT AND TRADEMARK OFFICE
CERTIFICATE OF CORRECTION

PATENT NO. : 7,531,427 B2 Page 1 of 1
APPLICATION NO. : 11/773893
DATED : May 12, 2009
INVENTOR(S) : Daval It is certified that error appears in the above-identified patent and that said Letters Patent is hereby corrected as shown below:

Column 10:
Line 60 (claim 7, line 9), change "pining" to -- pitting --.

Signed and Sealed this

Sixteenth Day of June, 2009

JOHN DOLL
*Acting Director of the United States Patent and Trademark Office*